(12) United States Patent  
Lynch

(10) Patent No.: US 8,030,913 B1  
(45) Date of Patent: Oct. 4, 2011

(54) DETECTOR CIRCUIT WITH IMPROVED BANDWIDTH

(75) Inventor: Jonathan J. Lynch, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 628 days.

(21) Appl. No.: 12/172,481

(22) Filed: Jul. 14, 2008

(51) Int. Cl.  
*G01R 19/00* (2006.01)

(52) U.S. Cl. .................................................. 324/76.11

(58) Field of Classification Search .......... 324/600, 324/76.11  
See application file for complete search history.

(56) References Cited

U.S. PATENT DOCUMENTS

| | | | |
|---|---|---|---|
| 3,668,554 A | 6/1972 | Dupre | 331/107 R |
| 3,670,328 A | 6/1972 | Mardon et al. | 342/104 |
| 3,882,396 A | 5/1975 | Schneider | 455/325 |
| 4,789,840 A | 12/1988 | Albin | 329/354 |
| 5,233,464 A | 8/1993 | Costich | 359/359 |
| 5,365,237 A | 11/1994 | Johnson et al. | 342/179 |
| 6,049,308 A | 4/2000 | Hietala et al. | 343/700 MS |
| 6,417,502 B1 | 7/2002 | Stoner et al. | 250/208.1 |
| 6,635,907 B1 | 10/2003 | Nguyen et al. | 257/183 |
| 6,845,184 B1 | 1/2005 | Yoshimura et al. | 385/14 |
| 2005/0264466 A1* | 12/2005 | Hibino et al. | 343/860 |

OTHER PUBLICATIONS

Hesler, J.L., et al., "Development of Compact Broadband Receivers at Submillimeter Wavelengths," IEEE Aerospace Conference Proceedings, pp. 735-740 (2004).

Moyer, H.P., et al., "Sb-Heterostructure Diode Detector W-band NEP and NEDT Optimization", Proceeding of SPIE vol. 6211, 62110J-1 (2006).

U.S. Appl. No. 11/303,642, filed Dec. 2005, Lynch, et al.

U.S. Appl. No. 12/359,986, filed Jan. 2009, Schaffner, James H.

Yujiri, L., "Passive Millimeter Wave Imaging," IEEE MII-S International Microwave Symposium Digest, 2006, pp. 98-101, Jun. 2006.

Moyer, H.P. et al., "Sb-Heterostructure Low Noise W-Band Detector Diode Sensitivity Measurements," IEEE MTT.S international Microwave Symposium Digest 2006, pp, 826-829, Jun. 2006.

Lynch, J., et al, "Unamplified Direct Detection Sensor for Passive Millimeter Wave Imaging," Proc. of SPIE on Passive Millimeter-Wave Imaging Technology, eds. R. Appleby and D. Wikner, vol. 6211, 2006.

Virk, R.S., et al, "A Lowcost W-band MIC Mixer using Flip-Chip Technology," IEEE Microwave and Guided Wave Letters, vol. 7, No. 9, Sep. 1997, pp. 294-296.

Kusamitsu, H., et al., "The Flip-Chip Bump Interconnection for Millimeter-Wave GaAs MMIC", IEEE Trans. on Electronics Packaging Manufacturing, vol. 22, No. 1 Jan. 1999, pp. 23-28.

Ramo, S., et al., "Fields and Waves in Communication Electronics," 1st edition, 1965 John Wiley and Sons, 1965, pp. 465-467.

Lange, et al., "Development of a 3×3 Micromachined Millimeter Wave SIS Imaging Array," IEEE Trans. on Applied Superconductivity, vol. 7, No. 2., Jun. 1997.

(Continued)

*Primary Examiner* — Vincent Q Nguyen  
(74) *Attorney, Agent, or Firm* — Ladas & Parry

(57) ABSTRACT

A detector circuit for an operational bandwidth having a center frequency including a diode, a first inductor in series with the diode, a transmission line coupled across the diode on a first end of the transmission line, the transmission line having an impedance and being in length a quarter wavelength of a frequency near the center frequency of the operational bandwidth, and a capacitor coupled across a second end of the transmission line.

28 Claims, 6 Drawing Sheets

OTHER PUBLICATIONS

Arttu Luukanen, Aaron J. Miller, and Erich N. Grossman, "Active Millimeter-wave Video Rate Imaging With a Staring 120- element Microbolometer Array," Proc. SPIE Int. Soc. Opt. Eng. 5410, 195 (2004).

Siegel, P., "Terahertz Technology," IEEE Trans. on Microwave Theory and Techniques, vol. 50, No. 3, Mar. 2002.

"Thin Film Products Guideline," American Technical Ceramics at www.atceramics.com/products/thinfilm.asp, May 1, 2009.

* cited by examiner

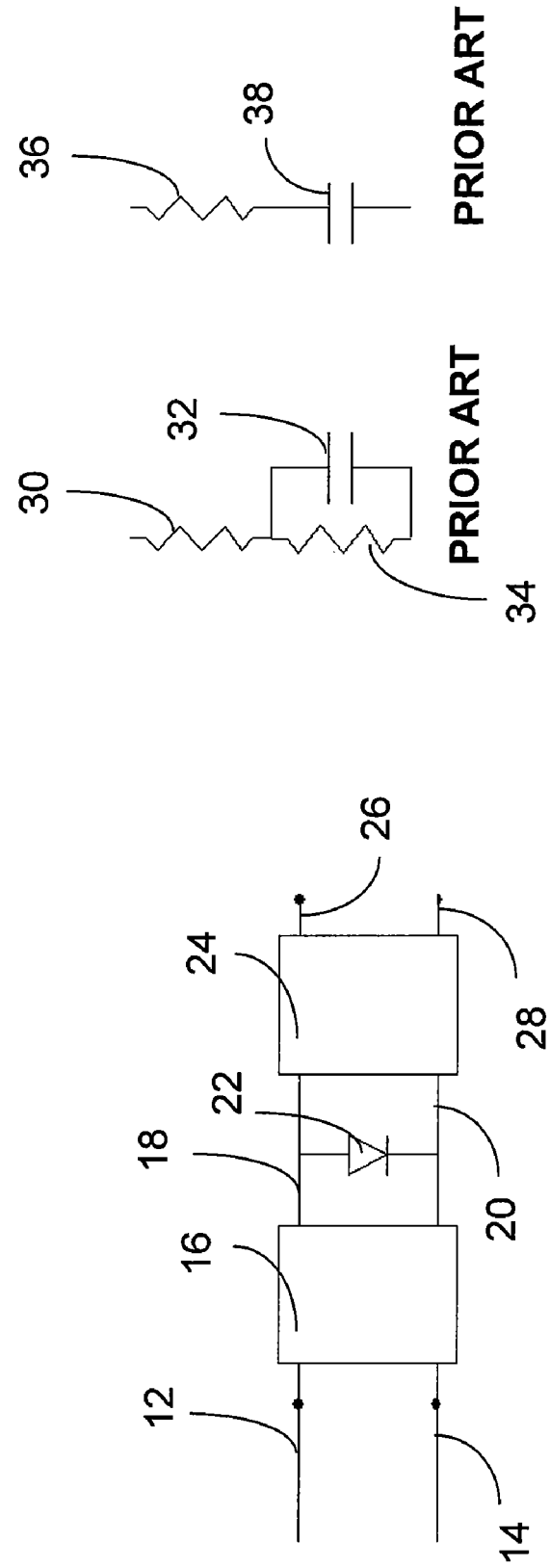

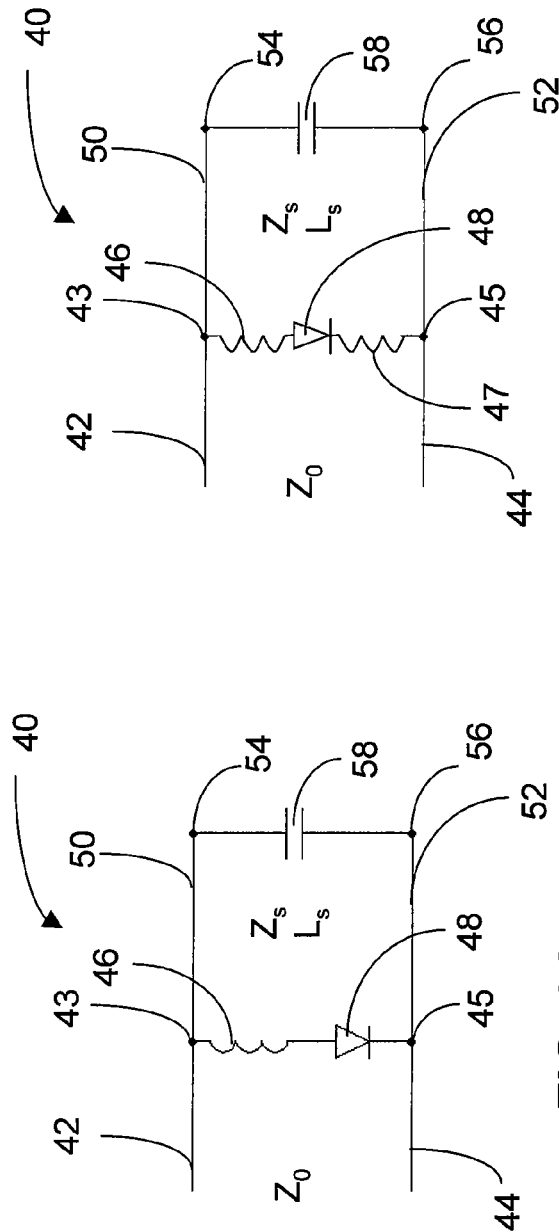
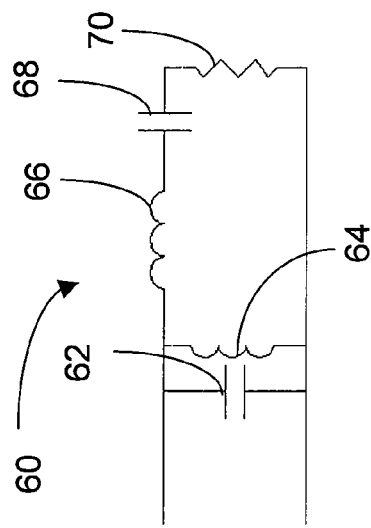
FIG. 3A
FIG. 3B
FIG. 4

DETECTOR CIRCUIT WITH IMPROVED BANDWIDTH

STATEMENT OF GOVERNMENT INTEREST

The US Government has a paid up license in this invention and the right in limited circumstances to require the patent owner to license others on reasonable terms as provided for by the terms of W911QX-04-C-0127 awarded by DARPA.

TECHNICAL FIELD

This disclosure relates to detector circuits and in particular to detector circuits for millimeter wave frequencies.

BACKGROUND

Detector circuits have been implemented in the prior art with discrete diodes and external impedance matching and video filtering circuitry. At millimeter wave frequencies these diodes are typically single discrete devices that are mounted on a substrate. Impedance matching and video filtering for the detector circuit are also mounted on the substrate, with the input matching network on the input side of the discrete diode, and the output video filter network on the other side of the discrete diode. Such a detector circuit is described in "Development of Compact Broadband Receivers at Submillimeter Wavelengths" by J. L. Hesler, D. W. Porterfield, W. L. Bishop, T. W. Crowe, and P. Racette, 2004 IEEE Aerospace Conference Proceedings IEEE, pages 735-740. The resulting detector circuit is a physically large circuit with limited sensitivity.

Another example of the prior art is a W band detector developed at HRL Laboratories, LLC. This detector circuit is similar to detectors implemented in commercial millimeter wave imaging cameras. The W band detector is implemented using discrete diodes mounted on a circuit board. Input filtering is provided on the input side of the detector, and output filtering on the output side. This W band detector has high sensitivity, but very narrow bandwidth and is described in "Sb-Heterostructure Diode Detector W-band NEP and NEDT Optimization" by H. P. Moyer, R. L. Bowen, J. N. Schulman, D. H. Chow, S. Thomas III, T. Y. Hsu, J. J. Lynch, and K. S. Holabird Proceeding of SPIE Volume 6211, 62110J-1 (2006).

FIG. 1 shows a block diagram of a typical detector circuit. It consists of an input matching network 16 between input transmission lines 12 and 14 and a diode 22, and an output filter network 24 between the diode 22 and the output transmission lines 26 and 28. The diode 22 can be connected in shunt between lines 18 and 20, as shown in FIG. 1 or in series on line 18 (not shown). In either case it is critically important that the output signal between output transmission lines 26 and 28 has a bandwidth extending down to zero Hertz (DC). For example, the output filter network 24 shown in FIG. 1 cannot have a capacitor connected in series between the diode 22 and the output transmission line 26 since this would block zero Hz. Similarly, if the diode is connected in series, then a shunt inductor must be in the circuit in order that the output signal can be read across output transmission lines 26 and 28. This shunt inductor is typically referred to as a "DC return."

The purpose of the input matching network 16 is to provide an impedance match for maximum delivery of incident power from the input transmission lines 12 and 14 to the diode 22. The output filter network 24 ideally blocks any RF signal frequencies from the output signal, while passing lower frequency video signals to the output transmission lines 26 and 28.

FIG. 2A shows the equivalent circuit of a typical detector diode. It consists of a nonlinear junction resistance 34, a junction capacitance 32, and a series resistance 30. In order to achieve high sensitivity, this device must be impedance matched to an input transmission line. Typical parameter values for an exemplary Backward Tunnel Diode (BTD) are: Cj=8fF, Rj=1400 ohms, and Rs=25 ohms, and the Backward Tunnel Diode is designed to operate up to about 110 GHz. Given these typical parameters, one can show that the diode impedance looks similar to a resistor 36 and a capacitor 38 in series, as shown in FIG. 2B. The values of resistor 36 and capacitor 38 are given approximately by $$R = R_s\left(1 + \frac{1}{\left(\omega\sqrt{R_s R_j}\, C_j\right)^2}\right), C = C_j.$$

To obtain the widest possible bandwidth, which is important for passive millimeter wave imaging applications, communications, and other applications, the diode capacitance can be resonated by an inductance in the input matching network 16. The inductance value chosen will typically be about equal to $$L = \frac{1}{\omega_o^2 C},$$

where $\omega_o$ is the center frequency in radians per second of the operational bandwidth of the detector circuit.

The output filter network 24 typically consists of a low pass filter to pass the low frequency video output, while blocking the RF signal from the output signal. For example, for the shunt connected diode of FIG. 1 the output filter network 24 may consist of an inductor in series with the load. This circuit ensures detection down to zero Hz (DC) and has high impedance at the center frequency, thereby blocking the RF signal from the output transmission lines 26 and 28, while not degrading the RF operation of the circuit. An example of a circuit that would not work well for FIG. 1 is a large shunt capacitor connected directly across the diode. Although this allows DC to pass to the output transmission lines 26 and 28, and blocks RF from the output signal, it effectively short circuits the diode at RF, which disrupts the RF operation of the detector circuit.

What is needed is a detector circuit that has a wide operational bandwidth, while isolating the RF input signal from the output signal. The embodiments of the present disclosure answer these and other needs.

SUMMARY

In a first embodiment disclosed herein, a detector circuit for an operational bandwidth having a center frequency comprises a diode, a first inductor in series with the diode, a transmission line coupled across the diode on a first end of the transmission line, the transmission line having an impedance and being in length a quarter wavelength of a frequency near the center frequency of the operational bandwidth, and a capacitor coupled across a second end of the transmission line.

In another embodiment disclosed herein, a detector circuit for an operational bandwidth having a center frequency comprises an input transmission line, a diode coupled across the input transmission line, a first inductor in series with the diode, a second transmission line coupled across the diode on a first end of the second transmission line, the second transmission line having an impedance and being in length a quarter wavelength of a frequency near the center frequency of the operational bandwidth, and a capacitor coupled across a second end of the transmission line.

In another embodiment disclosed herein, a detector circuit for an operational bandwidth having a center frequency comprises an input transmission line coupled to a first inductor and a second inductor, a diode coupled between the first inductor and the second inductor, a second transmission line coupled to the first inductor and the second inductor on a first end of the second transmission line, the second transmission line having an impedance and being in length a quarter wavelength of a frequency near the center frequency of the operational bandwidth, and a capacitor coupled across a second end of the transmission line.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 1 shows a typical detector circuit having a input matching network, a detector, and an output filter network in accordance with the prior art;

FIG. 2A is a typical circuit model for a diode in accordance with the prior art;

FIG. 2B is another typical circuit model for a diode in accordance with the prior art;

FIGS. 3A and 3B are detector circuits in accordance with the present disclosure;

FIG. 4 is a circuit model of the detector circuit of FIG. 3A or 3B in accordance with the present disclosure;

DETAILED DESCRIPTION

Figure 5:
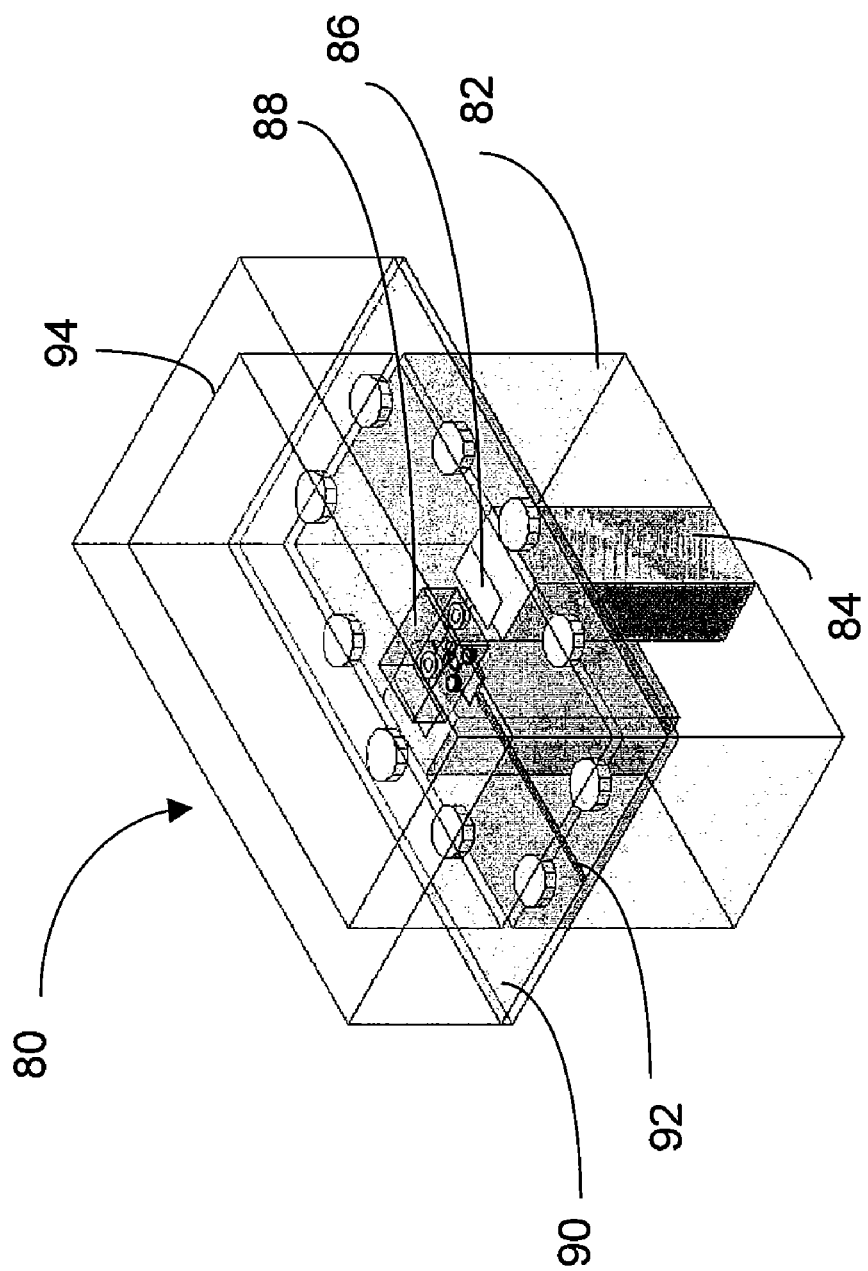
FIG. 5 is a perspective view of a detector circuit in an application in accordance with the present disclosure.

Referring now to FIG. 3A, one embodiment of a detector circuit 40 is shown. The signal input to the detector circuit 40 is via an input transmission line, which has a signal line 42, a return line 44, and an impedance of $Z_0$. An inductor 46 is in series with a diode 48 and the input transmission line is attached across inductor 46 in series with a diode 48 at first terminal 43 and second terminal 45. The inductor 46 improves the operational bandwidth of the detector circuit by resonating with the capacitance inherent in the diode. The inductance value for the inductor 46 is typically chosen to be about equal to $$L = \frac{1}{\omega_0^2 C},$$

where $\omega_0$ is the center frequency ($f_0$) in radians per second ($\omega_0 = 2\pi f_0$) of the operational bandwidth and C is the junction capacitance of the diode.

A first end of a second transmission line, which has a second signal line 50 and second return line 52, is attached across the inductor 46 in series with a diode 48 at first terminal 43 and second terminal 45. The second transmission line has an impedance of $Z_s$ and a length of $L_s$. A second end of the second transmission line is attached across capacitor 58, with the second signal line 50 attached to the first capacitor terminal 54 and the second return line 52 attached to the second capacitor terminal 56. The output signal of the detector circuit is the voltage across the capacitor 58 between first capacitor terminal 54 and second capacitor terminal 56. The capacitor 58 effectively filters the RF signal from the output signal and the capacitance of the capacitor 58 is typically chosen to be substantially greater than $(1/(2 f_0 \times Z_s))$.

The combination of capacitor 58 and the second transmission line (second signal line 50 and second return line 52) with impedance $Z_s$ and a length of $L_s$ provides an additional resonance for providing a wide bandwidth for the detector circuit. Choosing the capacitance of capacitor 58 to be substantially greater than the inverse of $(2 f_0 \times Z_s)$, effectively creates a short circuit to the RF signal frequencies, thereby removing the RF signal frequencies from the output signal. By choosing the length $L_s$ of the second transmission line (50,52), to be about a quarter wavelength of a frequency near the center of the operating bandwidth, the combination of the capacitor 58 with the second transmission line (second signal line 50 and second return line 52) appears to be a parallel resonator. In a preferred embodiment the length $L_s$ of the second transmission line is a quarter wavelength of the center frequency of the operating bandwidth.

It is important that the capacitor 58 is not connected directly across diode 48. As discussed above, a large shunt capacitor connected directly across the diode would allow DC to pass to the output transmission lines 26 and 28, and would block RF from the output signal. However, a large shunt capacitor connected directly across the diode would also effectively short circuit the diode at RF signal frequencies, which would not allow the diode to detect the envelope of the RF signal. The effect would be an inoperable detector circuit.

FIG. 3B is another embodiment of the detector circuit. The difference between the embodiment of FIG. 3A and FIG. 3B is that in FIG. 3B there is a second inductor 47 in series with the diode 48. The circuit of FIG. 3A can be referred to as an unbalanced detector circuit. FIG. 3B is a balanced detector circuit and shows the circuit diagram for the embodiments discussed below in reference to FIGS. 5, 6 and 7.

FIG. 4 is a circuit model of the detector circuit of FIG. 3A or 3B. The combination of the capacitor 58 with the second transmission line of FIG. 3A or 3B is represented in the circuit model of FIG. 4 by capacitor 62 and parallel inductor 64. Thus, the equivalent network of the combination of the capacitor 58 with the second transmission line appears as a classic band pass filter. In FIG. 4 the inductor 66 represents inductor 46 of FIG. 3A or inductors 46 and 47 of FIG. 3B, and capacitor 68 and resistor 70 represent the equivalent circuit for the diode 48.

The detector circuit 88 is shown in one embodiment in the perspective view of FIG. 5. The detector circuit 88 is coupled directly to a waveguide 82 that is terminated in a horn antenna (not shown). This structure 80 is called a radiometer, since it measures the intensity of radiation incident, and is commonly used in millimeter wave imaging cameras. The input waveguide 82 has ridges 84 to extend the input bandwidth. A microwave circuit board 90 contains E-plane probes 86, a flip-chip integrated circuit 88 that implements the detector circuit, and video output transmission line 92. A backshort cavity 94 reflects incident energy back toward the detector circuit 88. The incident energy collected by the horn antenna (not shown) travels down the waveguide toward the flip chip integrated circuit 88 containing the detector circuit 40. The E plane probes 86 are excited by the incident energy in a manner similar to a dipole antenna and are connected directly to the flip chip detector circuitry through metal bumps.

Figure 6:
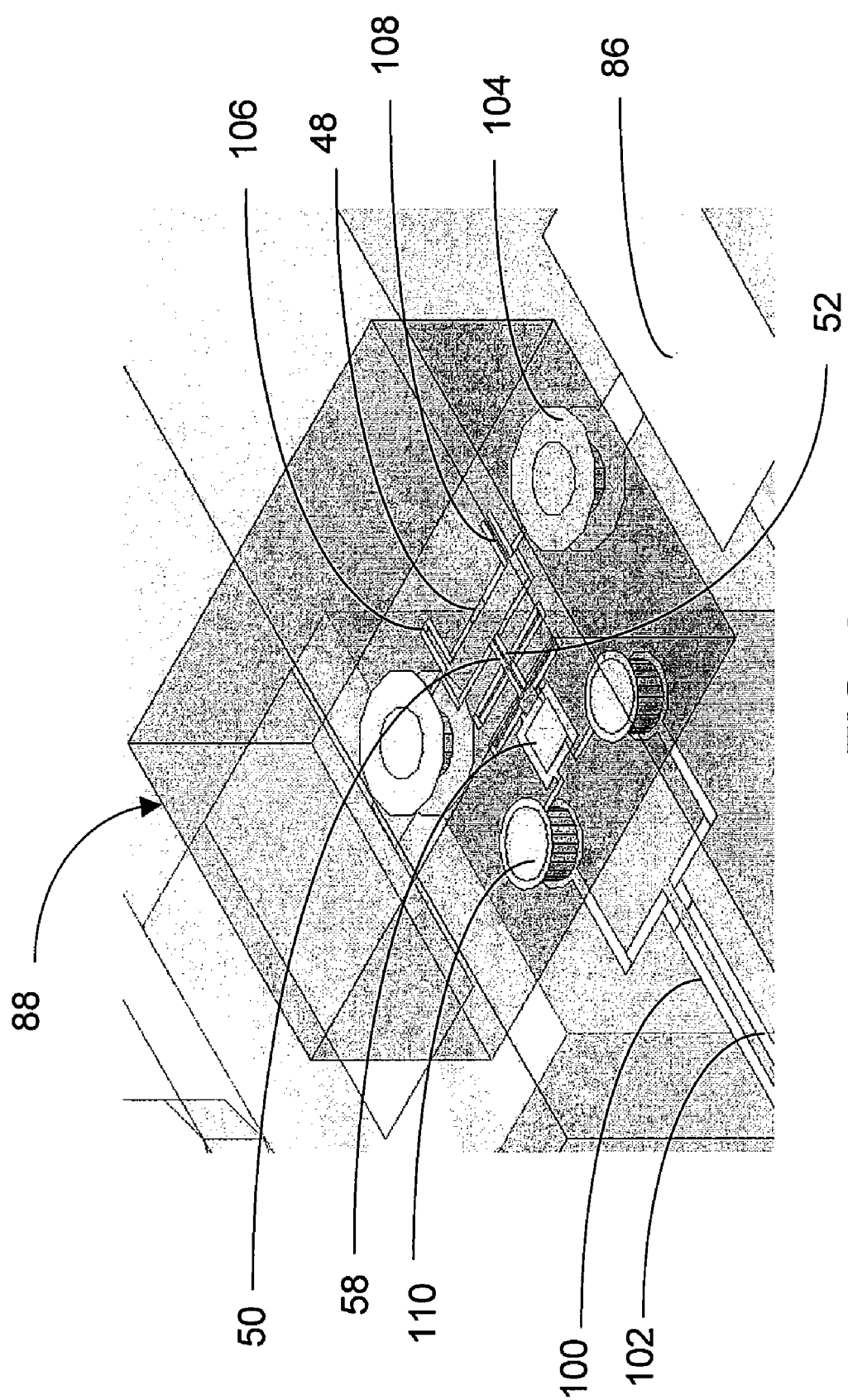
FIG. 6 is a perspective view of a detector circuit implementation in accordance with the present disclosure.

FIG. 6 shows a closer perspective view of the flip chip integrated circuit 88, which has metal bumps 104 that connect to the E plane probes 86 to carry the signal through a first meander line inductor 106 in series with diode 48. A second meander line inductor 108 is on the other side of the diode 48 and is also in series with diode 48. FIG. 6 also shows the second transmission line with second signal line 50 and second return line 52 connected between the combination of the diode 48 and first and second meander line inductors 106 and 108, and the capacitor 58. The capacitor terminals are also connected to video bumps 110 that are connected to output transmission line 92, shown in FIG. 6 as video signal line 100 and video signal line 102.

Figure 7:
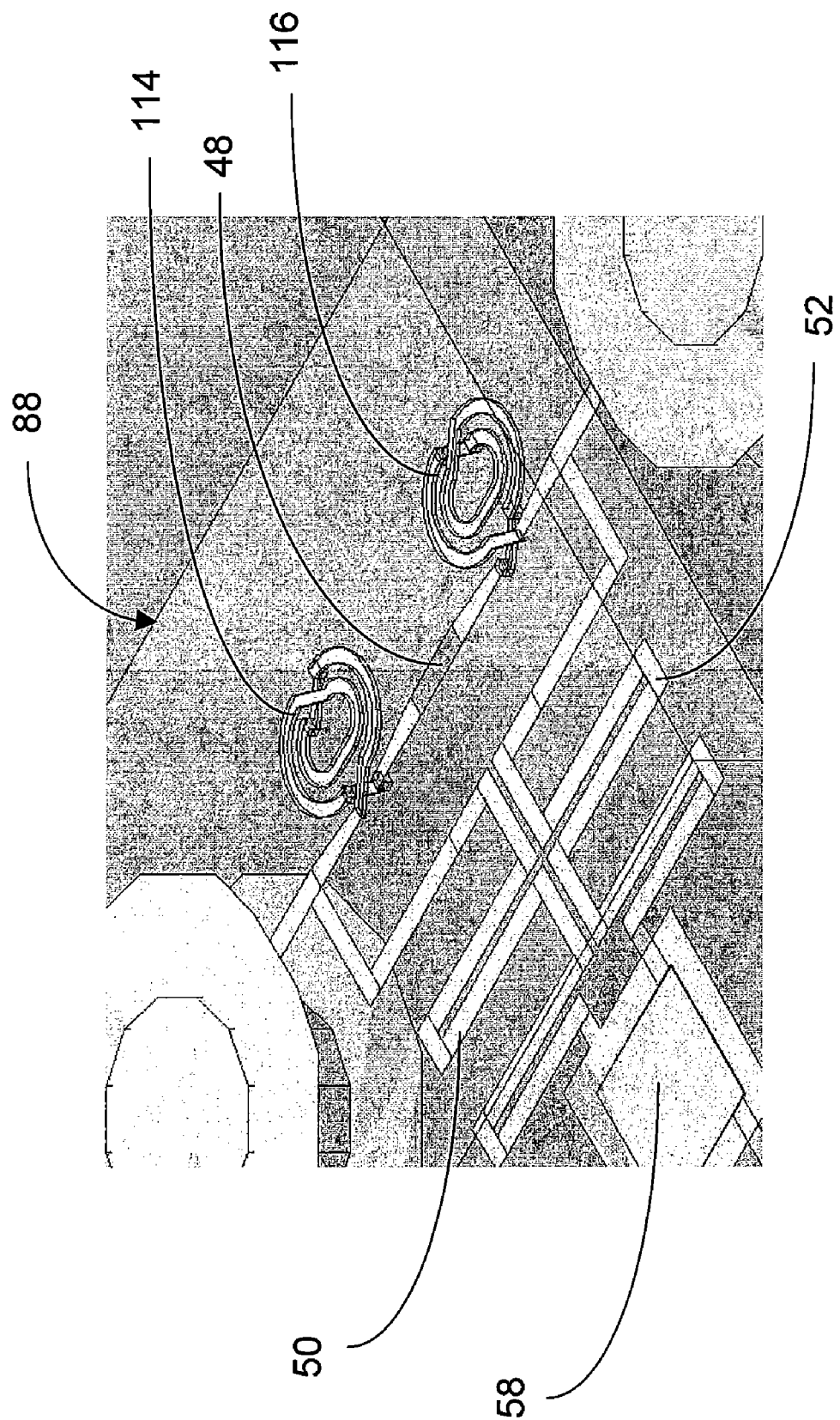
FIG. 7 is a perspective view of another detector circuit implementation in accordance with the present disclosure.

FIG. 7 shows a close perspective view of another embodiment of the detector circuit 88. In this embodiment the first and second meander line inductor 106 and 108 are replaced with spiral inductors 114 and 116. The other portions of the circuit are similar to the embodiment of FIG. 6.

Figure 8:
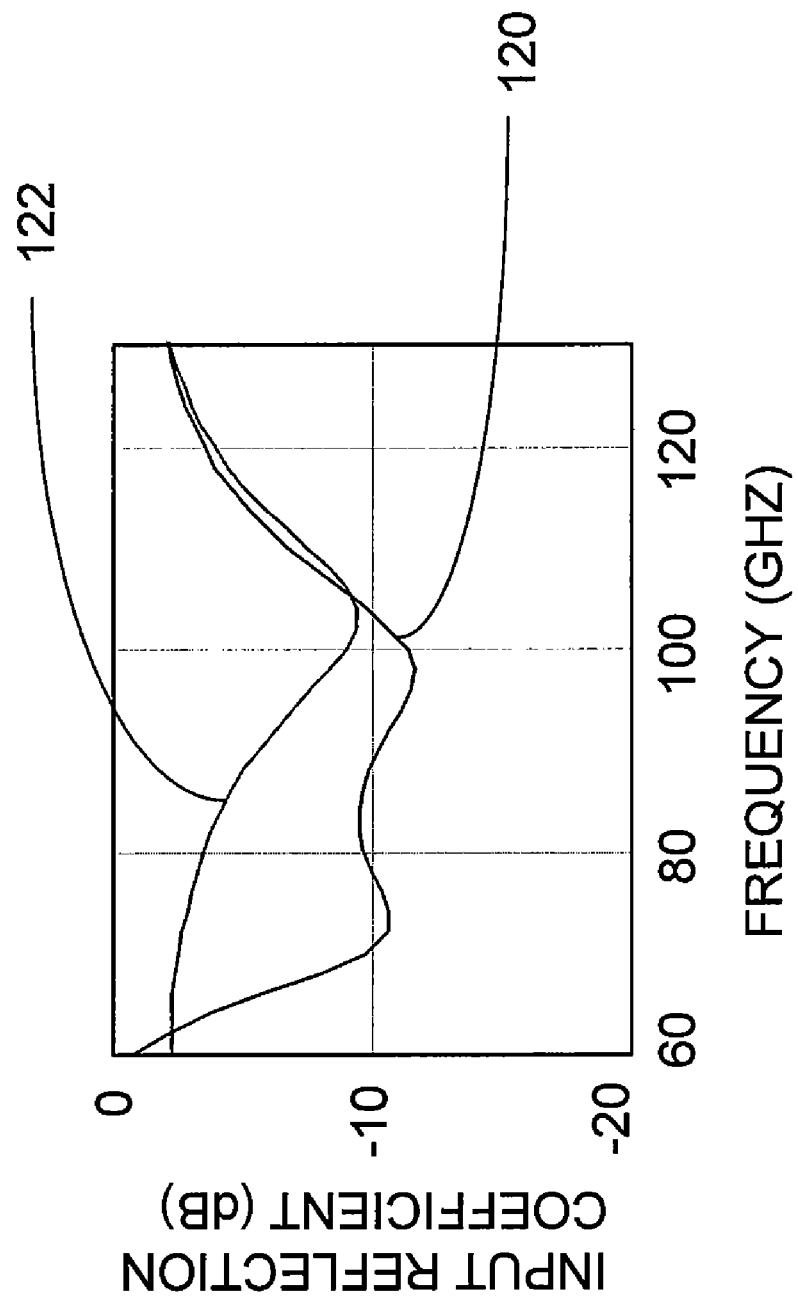
FIG. 8 is a graph showing the input reflection coefficient versus frequency for a detector circuit in the prior art compared to a detector circuit in accordance with the present disclosure.

FIG. 8 is a graph showing the input reflection coefficient versus frequency for a detector circuit in the prior art compared to the detector circuit 40 of FIG. 3B. The response 120 for the detector circuit 40 is fairly flat over a wide bandwidth. The detector circuit bandwidth response 122 for a prior art detector circuit with a prior art output filter network 24 is substantially narrower than for the detector circuit of FIG. 3B. This demonstrates that the combination of the capacitor 58 and the second transmission line with impedance $Z_s$ and a length of $L_s$ provides a wide operational bandwidth for the detector circuit.

Using an integrated circuit provides high sensitivity detection of RF signals. Incorporating the detector circuit of FIG. 3A or 3B directly on the integrated circuit simplifies external circuitry and significantly improves detector performance, especially at millimeter wave (30-300 GHz) frequencies. Employing the circuitry or portions of the circuitry off chip at these frequencies would lead to narrowband operation due to the unavoidable parasitic reactances associated with the RF transitions on and off chip. Incorporating this circuitry on chip reduces these parasitics, increasing the bandwidth and sensitivity of the detector. An integrated circuit also reduces the overall circuit size and thereby the integrated circuit cost. As important, the size of the integrated circuit, which is approximately 0.5 mm by 0.5 mm, allows the circuit to be integrated into compact systems such as receiver antennas with improved performance over more discrete component embodiments.

The embodiment using a waveguide input is just one of many possible embodiments. Instead of a waveguide input one may use a planar transmission line such as microstrip or coplanar waveguide as the input guide.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . . ."

What is claimed is:

1. A detector circuit for an operational bandwidth having a center frequency, the detector circuit comprising:
   a diode;
   a first inductor in series with the diode;
   a transmission line having a signal line coupled to the diode and having a return line coupled to the first inductor on a first end of the transmission line, the transmission line having an impedance and being in length a quarter wavelength of a frequency near the center frequency of the operational bandwidth; and
   a capacitor connected between the signal line and the return line on a second end of the transmission line.

2. The detector circuit of claim 1 wherein the detector circuit is an integrated circuit, the integrated circuit being approximately 0.5 mm by 0.5 mm.

3. The detector circuit of claim 1 further comprising a second inductor in series with the diode.

4. The detector circuit of claim 3 wherein the first and second inductors are meander inductors.

5. The detector circuit of claim 3 wherein the first and second inductors are spiral inductors.

6. The detector circuit of claim 1 wherein the operational bandwidth comprises millimeter wave frequencies.

7. The detector circuit of claim 1 wherein the capacitor has a capacitance substantially greater than an inverse of a product of 2 pi multiplied by a frequency near the center frequency of the operational bandwidth multiplied by the impedance of the transmission line.

8. A detector circuit for an operational bandwidth having a center frequency, the detector circuit comprising:
   an input transmission line having a first signal line and a first return line;
   a diode coupled to the first signal line;

a first inductor coupled in series with the diode and coupled to the first return line;

a second transmission line having a second signal line and a second return line, the second signal line coupled to the diode and the second return line coupled to the first inductor on a first end of the second transmission line, the second transmission line having an impedance and being in length a quarter wavelength of a frequency near the center frequency of the operational bandwidth; and a capacitor connected between the second signal line and the second return line at a second end of the transmission line.

9. The detector circuit of claim 8 wherein the detector circuit is an integrated circuit, the integrated circuit being approximately 0.5 mm by 0.5 mm.

10. The detector circuit of claim 8 further comprising a second inductor coupled between the diode and the first return line.

11. The detector circuit of claim 10 wherein the first and second inductors are meander inductors.

12. The detector circuit of claim 10 wherein the first and second inductors are spiral inductors.

13. The detector circuit of claim 8 wherein the operational bandwidth comprises millimeter wave frequencies.

14. The detector circuit of claim 8 wherein the capacitor has a capacitance substantially greater than an inverse of a product of 2 pi multiplied by a frequency near the center frequency of the operational bandwidth multiplied by the impedance of the second transmission line.

15. A detector circuit for an operational bandwidth having a center frequency, the detector circuit comprising:

an input transmission line having a first signal line coupled to a first inductor and first return line coupled to a second inductor;

a diode coupled between the first inductor and the second inductor;

a second transmission line having a second signal line coupled to the first inductor and having a second return line coupled to the second inductor on a first end of the second transmission line, the second transmission line having an impedance and being in length a quarter wavelength of a frequency near the center frequency of the operational bandwidth; and a capacitor connected between the second signal line and the second return line on a second end of the transmission line.

16. The detector circuit of claim 15 wherein the operational bandwidth comprises millimeter wave frequencies.

17. The detector circuit of claim 15 wherein the capacitor has a capacitance substantially greater than an inverse of a product of 2 pi multiplied by a frequency near the center frequency of the operational bandwidth multiplied by the impedance of the second transmission line.

18. The detector circuit of claim 15 wherein the first and second inductors are meander inductors.

19. The detector circuit of claim 15 wherein the first and second inductors are spiral inductors.

20. The detector circuit of claim 15 wherein the length of the second transmission line is a quarter wavelength of the center frequency of the operational bandwidth.

21. The detector circuit of claim 15 wherein a signal is detected by the detector circuit by detecting voltage across the capacitor.

22. The detector circuit of claim 15 wherein the detector circuit is integral to an integrated circuit, the integrated circuit being approximately 0.5 mm by 0.5 mm.

23. A method of providing a detector circuit for an operational bandwidth having a center frequency, the method comprising integrating:

an input transmission line having a first signal line and a first return line;

a diode coupled to the first signal line;

a first inductor coupled in series with the diode and coupled to the first return line;

a second transmission line having a second signal line and a second return line, the second signal line coupled to the diode and the second return line coupled to the first inductor on a first end of the second transmission line, the second transmission line having an impedance and being in length a quarter wavelength of a frequency near the center frequency of the operational bandwidth; and a capacitor connected between the second signal line and the second return line at a second end of the transmission line.

24. The method of claim 23 wherein the detector circuit is integrated on an integrated circuit, the integrated circuit being approximately 0.5 mm by 0.5 mm.

25. The method of claim 23 further comprising integrating a second inductor coupled between the diode and the first return line.

26. The method of claim 25 wherein the first and second inductors are meander inductors or spiral inductors.

27. The method of claim 23 wherein the operational bandwidth comprises millimeter wave frequencies.

28. The method of claim 23 wherein the capacitor has a capacitance substantially greater than an inverse of a product of 2 pi multiplied by a frequency near the center frequency of the operational bandwidth multiplied by the impedance of the second transmission line.

\* \* \* \* \*